United States Patent [19]

Prestele

[11] Patent Number: 5,422,531
[45] Date of Patent: Jun. 6, 1995

[54] ELECTRO-ACOUSTIC COMPONENT OF PIEZO CERAMIC MATERIAL AND METHOD FOR FREQUENCY SETTING OR, RESPECTIVELY, TRANSIT TIME BALANCING OF THE COMPONENT

[75] Inventor: Karl Prestele, Erlangen, Germany

[73] Assignee: Siemens Aktiengesellschaft, Munich, Germany

[21] Appl. No.: 672,751

[22] Filed: Mar. 21, 1991

Related U.S. Application Data

[63] Continuation of Ser. No. 403,360, Sep. 6, 1989, abandoned.

[30] Foreign Application Priority Data

Sep. 14, 1988 [EP] European Pat. Off. ............ 88115022

[51] Int. Cl.⁶ .............................................. H01L 41/08
[52] U.S. Cl. .............................. 310/313 A; 310/313 D; 310/358; 310/359; 333/152
[58] Field of Search ........................... 310/357–359, 310/313 R, 313 A, 313 D; 333/154

[56] References Cited

U.S. PATENT DOCUMENTS

| | | | |
|---|---|---|---|
| 3,699,482 | 10/1972 | Ash et al. | 333/150 |
| 3,710,465 | 1/1973 | Thomann | 310/313 R X |
| 3,713,036 | 1/1973 | Thomann | 333/150 |
| 3,750,056 | 7/1973 | Subramanian | 333/72 |
| 3,821,667 | 6/1974 | Thomann | 310/313 R X |
| 3,840,826 | 10/1974 | Toda et al. | 310/313 R X |
| 3,924,145 | 12/1975 | Kansy | 333/152 X |
| 4,037,175 | 7/1977 | Kansy et al. | 310/313 R X |
| 4,410,823 | 10/1983 | Miller et al. | 310/313 D |
| 4,697,115 | 9/1987 | Mitsutsuka | 310/313 R |

FOREIGN PATENT DOCUMENTS

| | | | |
|---|---|---|---|
| 0141487 | 5/1985 | European Pat. Off. | H03H 3/10 |
| 2317761 | 10/1974 | Germany | H03H 9/09 |

Primary Examiner—Mark O. Budd
Attorney, Agent, or Firm—Hill, Steadman & Simpson

[57] ABSTRACT

Electrical components, such as filters, oscillators, resonators and delay lines are manufactured from a piezo ceramic base which includes a depolarized zone. The sound velocity is set by topically heating a portion of the base to form the depolarized zone between a pair of transducers.

2 Claims, 1 Drawing Sheet

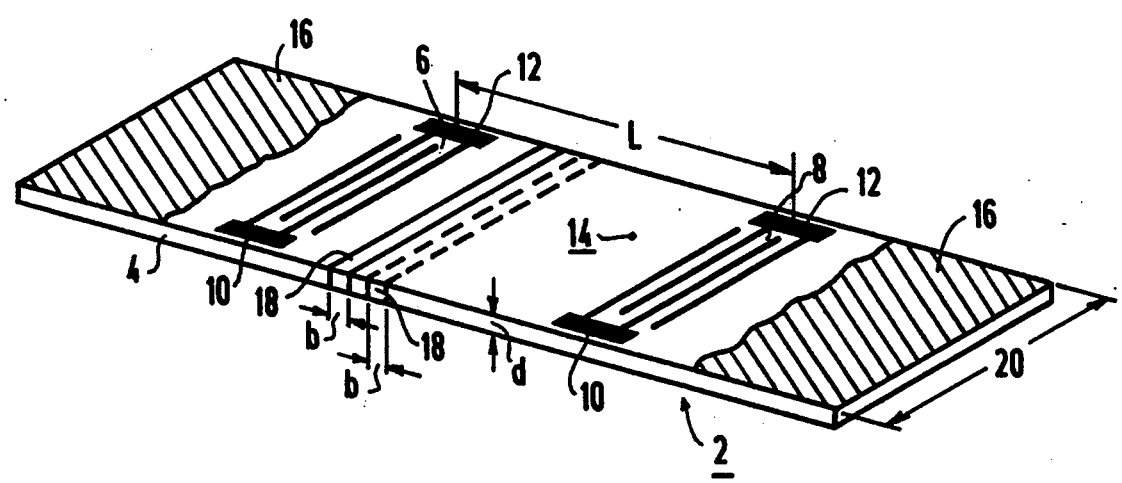

ELECTRO-ACOUSTIC COMPONENT OF PIEZO CERAMIC MATERIAL AND METHOD FOR FREQUENCY SETTING OR, RESPECTIVELY, TRANSIT TIME BALANCING OF THE COMPONENT

This is a continuation of application Ser. No. 07/403,360, filed Sep. 6, 1989, now abandoned.

BACKGROUND OF THE INVENTION

1. Field of the Invention

The present invention is directed to an electro-acoustic component of piezo ceramic material, such as electric filters, oscillators, resonators and delay elements.

2. Description of the Prior Act

In electro-acoustic components of piezo ceramic material, tolerances of the frequency behavior or of the delay time are essentially defined by the tolerance of the sound velocity. In high-quality lead-zirconate-titanate ceramics (PZT ceramics), a sound velocity tolerance of ±0.5% is currently achieved at best. Narrower tolerances can be achieved by balancing the components.

A method for balancing or varying the transit time between an input transducer and an output transducer on a piezo electric substrate of polarized ceramic is disclosed in U.S. Pat. No. 3,710,465. The remanence polarization is varied therein by applying an electrical field. The modified remanence polarization results in a modified elasticity modules and, therefore, in a modified sound velocity. Large-area electrodes, however, must be present on the component for this purpose. Due to the great steepness of the hysteresis loop in the region of the coercive field strengths, the desired, new polarization can only be inaccurately approached with field strengths in the region of the coercive field strengths.

A method for setting piezo electric, monolithic ceramic filters is set forth in German Patent 236 836. The exact setting of important filter parameters therein occurs by eroding electrode material with laser emission. The dependency of the essentially electrical filter characteristics on the dimensions of the metal electrode configuration of the filter lamina is thereby exploited. Optimum and accurately-reproducible filter properties can thereby be achieved in mass production. However, high temperatures are required for eroding the metallic electrode material and the risk of crack formation and of depolarization is thereby present for piezo ceramic substrates.

A further method for setting the frequency-amplitude characteristic of interdigital transducers is disclosed in German Published Application 23 17 761. The effective finger length of the transducers in this techniques is not influenced by modifying the electrode dimensions but is influenced by depolarization of the piezo electric ceramic substrate lying therebelow. The depolarization is achieved by local heating of the ceramic substrate above the Curie temperature with the assistance of focused laser emission.

Crystalline, piezo electric substrates such as, for example, quartz or lithium-niobate are also employed without additional setting given higher tolerance requirements. Lower band widths and higher insertion attenuation must be accepted due to the significantly poorer electro-mechanical coupling in these materials in comparison to piezo ceramic.

SUMMARY OF THE INVENTION

The object of the present invention therefor is to provide an electro-acoustic component having low insertion attenuation and having frequency behavior or, respectively, delay times to close tolerances. A method for precise setting is also provided.

This above object is achieved in that the piezo ceramic material comprises a depolarized zone that influences the transit time or the frequency behavior.

The method for manufacturing the electro-acoustic component is particularly characterized in that the piezo ceramic material is topically heated above the Curie temperature for setting the transmit time or the frequency behavior.

The present invention is based on the perception that the sound propagation in piezo ceramic substrates is dependent on the degree of polarization and on the sound propagation direction relative to the polarization direction. Typically, the sound velocity in a PZT ceramic, polarized up to saturation, is about 10–20% higher than in the unpolarized condition.

This effect is utilized for manufacturing the close-tolerance component in that the delay time or, respectively, the frequency behavior is adjustable to a prescribed value in small, defined steps on the basis of local, thermic depolarization. The depolarization is achieved in that the piezo ceramic material is locally heated to a temperature just above the Curie temperature.

Since, dependent on the ceramic, the Curie temperature lies between 200° C. and 400° C., the relatively "gentle" heating excludes damage to the ceramic such as, for example, crack formation, particularly given thin ceramic laminae as well.

An advantageous embodiment is characterized in that the depolarization zone extends column-shaped over the entire width of the component. Therefore, it is achieved that the depolarized zone uniformly influences the entire sound path.

Accordingly to an advantageous feature of the invention, the boundary surfaces between the depolarized zone and the piezo ceramic material are aligned at an angle relative to the sound propagation front. Noise signals that arise due to reflection at the transition from polarized to depolarized substrate regions because of the different characteristic impedances are thereby suppressed.

It is especially advantageous in the method for manufacturing the electro-acoustic component to implement the depolarization with a laser beam in non-contacting fashion since the wavelength and the power, as well as the spot diameter of the laser beam can thereby be so accurately set that the Curie temperature is not significantly exceeded in the material. Furthermore, an undesired spread of the depolarized zone due to thermal conduction is thereby nearly impossible.

According to a particular feature of the invention, the boundaries surfaces between the depolarized zone and the piezo ceramic material, as mentioned above, are aligned at an angle relative to the sound propagation front.

An electro-acoustic component according to the present invention is also particularly characterized in that the depolarized zone extends column-like over the entire width of the component.

A method for manufacturing the electro-acoustic component is particularly characterized in that the piezo ceramic material is topically heated above the Curie temperature for setting the transmit time or the frequency behavior.

The method of the present invention is also particularly characterized in that the topically heating occurs in a non-contacting fashion with laser light.

The method of the invention is also particularly characterized in that the topically heating occurs in a non-contacting fashion with a focused point light source.

The method of the invention is also particularly characterized in that the topical heating occurs by contact with a heated element.

BRIEF DESCRIPTION OF THE DRAWING

Other objects, feature an advantage of the invention, its organization, construction and operation will be best understood from the following detailed description, taken in conjunction with the accompanying drawing, on which there is a single FIGURE of a delay line of piezo ceramic material constructed with and in accordance with the present invention.

DESCRIPTION OF THE PREFERRED EMBODIMENTS

Referring to the drawing, a delay line 2 is constructed of a piezo ceramic material such as, for example, lead-zirconate-titanate (PZT Ceramic). Two electro-acoustic transducers, 6 and 8 are arranged at a spacing L on a monolithic substrate 4. The transducers 6 and 8 are each formed by an interdigital electrode structure of the electrodes 10 and 12 together with the region of the piezo ceramic substrate 4 lying therebelow.

The transducer 6, for example, produces an acoustic wave in the substrate 4 after the application of an electrical signal to its electrodes 10 and 12. The wave type is dependent on the direction of the electrical field relative to the polarization direction of the substrate 4. The substrate 4 herein is polarized such that an acoustic plate shear wave arises. The acoustic wave now runs over the distance L in the substrate 4 from the transducer 6 to the transducer 8. This region of the substrate 4 forms a transit time or delay path 14. The wave in opposite direction likewise emitted by the transducer 6 is absorbed by an absorber or by an acoustic sump 16. The transducer 8, in turn, converts the incident, acoustic wave into an electrical signal that is delayed by the time t in comparison to the signal at the transducer 6, corresponding to the transit time of the acoustic wave across the distance L. A further absorber or sump 16, arranged following the transducer 8, attenuates the continuing acoustic wave. Reflections at the edges of the substrate 4 (edge echoes) are suppressed by the two sumps 16.

Since the propagation speed of acoustic waves in piezo ceramic material is significantly lower than the propagation speed of electro magnetic waves, a correspondingly long delay an electrical signal is achieved by the distance L between the two transducers 6 and 8.

A column-shaped, depolarized zone 18 is created on the delay path 14 parallel to the sound propagation front. The zone extends over the entire width 20 of the substrate 4. Care should thereby be exercised to see that the zone 18 is uniformly heated over the substrate or lamina thickness d during the topical heating above the Cure temperature. In thicker plates, a simultaneous heating from both sides also comes into consideration. Given surface-wave components, it analogously applies that the width of the depolarized zone is greater than or equal to the penetration depth of the acoustic surface waves.

The delay time t on the delay path 14 is lengthened by the amount $$\Delta t = b \cdot \frac{v_p - v_d}{v_p \cdot v_d}$$

by the column-shaped, depolarized zone 18, whereby vp is the sound velocity in the polarized substrate 4 and vd is the sound velocity in the depolarized zone 18.

Since the transit time t can only be lengthened by the depolarization of the zone 18, the required correction play in the dimensioning of the delay path 14 must be offered on the basis of a corresponding shortening of the length L. The precise setting of the required delay time t occurs by joining depolarized zones 18 to one another, as indicated by broken lines in the drawing.

The transit time tolerance still admissible after setting is predominantly dependent on the width b of a single, depolarized zone 18.

When, for example, this should amount to $\pm \delta t$, then the width b of the depolarized zone 18 is theoretically obtained in accordance with the relationship:

$$b = 2\delta t \frac{v_p \cdot v_d}{v_p - v_d}.$$

The characteristic impedance of the depolarized zone 18 differs from the characteristic impedance of the polarized, piezo ceramic substrate. A part of the sound wave is thereby reflected. In order to suppress noise signals caused by multiple reflections, the boundary surfaces between the depolarized zone 18 and the polarized, piezo ceramic material and, therefore, the depolarized zone itself, can be aligned at an angle relative to the sound propagation front.

The depolarization of the zone 18 occurs particularly advantageously in a non-contacting fashion with a laser beam in a scan process. The wavelength and the power as well as the feed of the laser beam can thereby be adapted such in a simple manner that the Cure temperature or, respectively, the temperature required for complete depolarization is just reached. Too great a heating is avoid in that no undesired spread of the depolarized zone 18 due to heat conduction or crack formation in substrate 4 arises.

Since only relative small powers are required for depolarization, conventional point light sources having suitable focusing also come into consideration. The heating therein also occurs in non-contacting fashion.

Alternatively to non-contacting heating, the substrate 4 can be topically heated and, therefore, depolarized by contact with a heated element, for example a heatable wire.

For setting the desired delay time t, the delay time t can, for example, be measured after each newly-depolarized zone 18 and a decision as to whether further depolarized zones 18 should be applied or whether the best possible approximation to the rated value has been achieved can be made dependent on the result thereof.

It is likewise possible to calculate the plurality of required depolarized zones 18 from an initially-measured deviation from the rated value of the completely polarized substrate 14 and to then carry depolarization out in one work cycle without further measurements.

The frequency behavior or, respectively, the delay time of electro-acoustic components of piezo ceramic material can be very closely adjusted by arranging depolarized zones 18 in the transit time path 14 of these components. High-precision components having great band width and low insertion attenuation can therefore be manufactured in a simple manner.

Although I have described my invention by reference to particular illustrated embodiments thereof, many changes or modifications of the invention may become apparent to those skilled in the art without departing from the spirit and scope of the invention. I therefore intend to include within the patent warranted hereon all such changes and modifications as may reasonable and properly be including within the scope of my contribution to the art.

I claim:

1. An electro-acoustic component comprising:
   a base of polarized piezo ceramic material including a length and a width; a pair of transducers on said base spaced apart in the direction of the length in respective fixed positions with polarized piezo ceramic material of said base between said transducers; and
   a completely depolarized zone in said polarized piezo ceramic material of said base between said transducers and comprising at least one depolarized column-like zone extending across said base and including a width in the direction of the length of said base, the delay time or frequency behavior of said component being set exclusively by said width.

2. An electro-acoustic component according to claim 1, wherein excitation of one of said transducers causes sound propagation with a sound propagation front toward the other of said transducers, and wherein:
   said completely depolarized zone includes boundary surfaces disposed at an angle with respect to the sound propagation front.

* * * * *